US007757141B2

(12) United States Patent
Chickanosky et al.

(10) Patent No.: US 7,757,141 B2
(45) Date of Patent: Jul. 13, 2010

(54) AUTOMATICALLY EXTENSIBLE ADDRESSING FOR SHARED ARRAY BUILT-IN SELF-TEST (ABIST) CIRCUITRY

(75) Inventors: Valerie H. Chickanosky, South Burlington, VT (US); Kevin W. Gorman, Fairfax, VT (US); Michael R. Ouellette, Westford, VT (US); Michael A. Ziegerhofer, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 287 days.

(21) Appl. No.: 12/055,595

(22) Filed: Mar. 26, 2008

(65) Prior Publication Data

US 2009/0249146 A1 Oct. 1, 2009

(51) Int. Cl.
*G01R 31/28* (2006.01)
(52) U.S. Cl. .................. 714/733; 714/718
(58) Field of Classification Search .......... 714/723, 714/724, 735, 711, 719, 733, 718
See application file for complete search history.

(56) References Cited

U.S. PATENT DOCUMENTS 6,691,264 B2 * 2/2004 Huang ................. 714/723
6,728,910 B1 * 4/2004 Huang ................. 714/711
6,769,081 B1 7/2004 Parulkar
6,993,692 B2 * 1/2006 Ouellette et al. ........ 714/723
7,231,562 B2 6/2007 Ohlhoff et al.
7,610,527 B2 * 10/2009 Wang et al. ............. 714/724
2004/0071009 A1 4/2004 Chai et al.
2006/0218452 A1 9/2006 Njinda et al.
2008/0059850 A1 * 3/2008 Bahl ..................... 714/718
2009/0249146 A1 * 10/2009 Chickanosky et al. ..... 714/733

* cited by examiner

*Primary Examiner*—David Ton
(74) *Attorney, Agent, or Firm*—Michael LeStrange; Roberts Mlotkowski Safran & Cole, P.C.

(57) ABSTRACT

A method for testing integrated circuits (ICs) by automatically extending addressing for shared array built-in self-test (BIST) circuitry, includes polling a plurality of memories to determine which of the plurality of memories are sharing a first comparison tree and mapping a shared array BIST address space to each of the plurality of memories using the first comparison tree. Additionally, the method includes estimating a shared array BIST completion time corresponding to a most significant bits of a maximum total memory address size under test, reconfiguring the shared array BIST circuitry to accommodate the estimated shared array BIST completion time and testing the plurality of memories sharing the first comparison tree.

7 Claims, 2 Drawing Sheets

AUTOMATICALLY EXTENSIBLE ADDRESSING FOR SHARED ARRAY BUILT-IN SELF-TEST (ABIST) CIRCUITRY

FIELD OF THE INVENTION

The present invention generally relates to a method for testing integrated circuits (ICs), and more specifically, to a method for testing ICs by automatically extending addressing for shared array built-in self-test (ABIST) circuitry.

BACKGROUND OF THE INVENTION

As chips become more complicated with larger amounts of gates, cores, and memories being integrated into them, efficient test methods become more important. At the same time, as technology nodes become smaller, defects (particularly AC defects) can become more difficult to detect. This drives more focus on test quality, which in turn can increase complexity for test circuitry and often test circuit area. Any method that allows for the easy minimization of test time and test circuit area becomes beneficial.

Parallel array BIST test methods typically allow for the highest quality memory test. However, parallel array BIST test methods often require more chip area to implement than other array BIST test methods. A large amount of the overhead associated with parallel array BIST test methods are the comparison circuits used to compare all output values from a memory under test with all expected values and generate pass/fail information along with information on the failing bit location. This comparison and test data generation circuitry often takes the form of complex logic trees that can become quite large. These complex logic trees are often contained in a block of logic local to each memory under test, typically referred to as a BIO macro, or BIST Input/Output macro. The area of these comparison trees could be amortized across numerous memories (the BIO logic could be shared). However, these memories would then need to be tested sequentially (memory A tested using the comparison tree, then memory B tested using the comparison tree, then memory C for example). Typical off-the shelf array BIST circuits would normally be configured to simply test the largest possible total memory size (memory A size+memory B size+memory C size). However, in cases where the comparison tree was only shared amongst memory A and memory B, the BIST testing would typically continue operating as if memory C were still in place, needlessly extending the test time.

Accordingly, there exists a need in the art to overcome the deficiencies and limitations described hereinabove in a manner that does not require complicated software control or customized circuit designs.

SUMMARY OF THE INVENTION

In a first aspect of the invention, a method for testing integrated circuits (ICs) by automatically extending addressing for shared array built-in self-test (BIST) circuitry, comprises polling a plurality of memories to determine which of the plurality of memories are sharing a first comparison tree and mapping a shared array BIST address space to each of the memories sharing the first comparison tree. Additionally, the method comprises estimating a shared array BIST completion time corresponding to a maximum total memory address size under test, reconfiguring the shared array BIST circuitry to accommodate the estimated shared array BIST completion time and testing the plurality of memories sharing the first comparison tree.

In a further aspect of the invention, a system for testing integrated circuits (ICs) by automatically extending addressing for shared array built-in self-test (BIST) circuitry, comprises means for polling a plurality of memories to determine which of the plurality of memories are sharing a first comparison tree and means for mapping a shared array BIST address space to each of the plurality of memories sharing the first comparison tree. Additionally, the system comprises means for estimating a shared array BIST completion time corresponding to a maximum total memory address size under test and means for reconfiguring the shared array BIST circuitry to accommodate the estimated shared array BIST completion time. Furthermore, the system comprises means for testing the plurality of memories sharing the first comparison tree, wherein the means for polling the plurality of memories comprises means for generating a logical "1" signal at a shared array BIST engine, means for reconfiguring a plurality of shared array BIST input/output macros comprising a plurality of random access memory (RAM) enable latches connected to the shared array BIST engine, so that the plurality of RAM enable latches pass the logical "1" signal sequentially through each of the plurality of RAM enable latches and means for propagating the logical "1" signal through each of the plurality of RAM enable latches. Additionally, the means for estimating the shared array BIST completion time comprises means for counting a number of cycles for the logical "1" signal to return to the shared array BIST engine with a counter, wherein the number of cycles indicates at least one of a most significant bits of a maximum total memory address size under test and a maximum total number of memories sharing the first comparison tree.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to a method for testing integrated circuits (ICs), and more specifically, to a method for testing ICs by automatically extending addressing for shared array built-in self-test (ABIST) circuitry. By implementing the present invention, a reduction in test time may be achieved by exactly matching the BIST address space to the total number of memories using a shared comparison tree.

In embodiments, a BIST engine may poll the memories under test to determine how many of the memories under test are sharing any particular comparison tree and determine exactly how long the BIST should last (e.g., determine what is the maximum total memory address size under test). The BIST engine circuitry may then automatically reconfigure itself to test for the exact amount of time necessary. By implementing the present invention, automatically reconfiguring the BIST engine circuitry allows for both area savings (e.g., sharing the comparison tree) and time savings (e.g., no wasted test time) using a single BIST implementation (e.g., not changing or reprogramming the BIST circuitry for each instance of memories under test). This itself is valuable in that it reduces the need for complicated software control or customized test circuitry, reducing the design development time and/or the test software development time.

According to an aspect of the invention, a serial connection may be formed from the BIST engine circuitry through each BIO macro connected to the BIST engine. A logical "1" value may be propagated from the BIST engine through each BIO macro. The BIST engine may contain a small counter that counts the number of cycles it takes for the logical "1" to return to the BIST engine (indicating the number of BIO macros attached to the BIST engine). The output value of this counter may be used to determine the maximum count value for the most significant bits of the BIST address.

Figure 1:
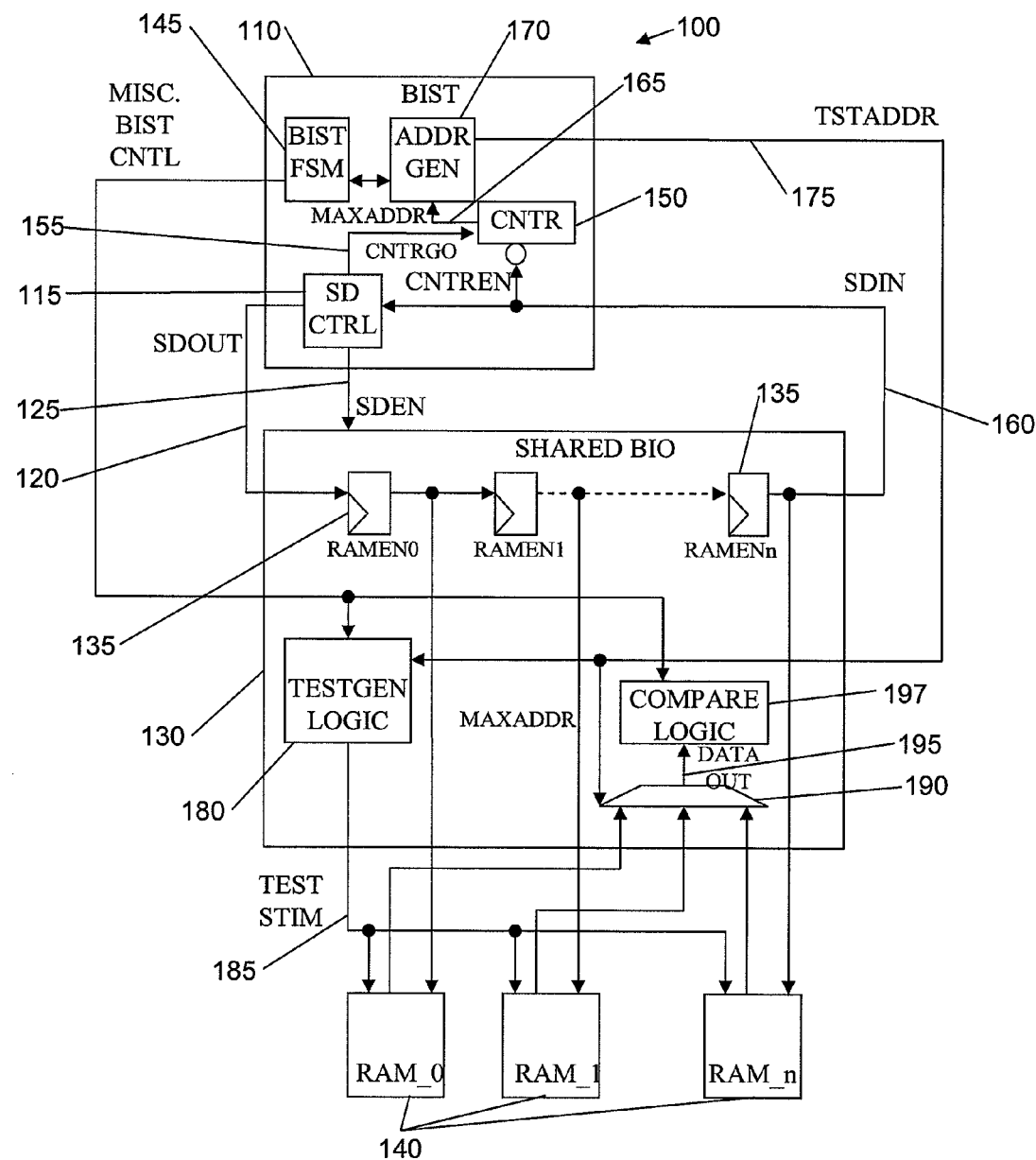
FIG. 1 shows an exemplary structure for implementing the present invention.

FIG. 1 shows an exemplary structure 100 for implementing the present invention. As shown in FIG. 1, a BIST engine 110 contains a SDCTRL (serial data control) unit 115 that produces a logical "1" value on the SDOUT (serial data output) wire 120 when the BIST engine 110 is enabled in an "address discovery" mode. While in the "address discovery" mode, the SDCTRL unit 115 will assert a SDEN (serial data enable) signal 125, which will cause the shared BIO circuit 130 to reconfigure the RAMEN (RAM enable) latches 135 into a "serial transmit" mode. While in the "serial transmit" mode, the RAM enable latches 135 will pass the logical "1" value sequentially through all of the RAM enable latches 135 and then back to the BIST engine 110 via the SDIN (serial data input) line 160.

The RAMEN latches 135 are necessary for normal test operation (for individually enabling/disabling each RAM under test), and consequently, there should be one RAM enable latch 135 per RAM under test 140, even when other BIO test circuitry is shared. The RAMEN latches 135 are normally controlled by BIST FSM (finite state machine) 145, although the connection between the RAMEN latches 135 and the BIST FSM 145 is not depicted in FIG. 1.

A CNTR (counter) 150 begins to count from zero after a "CNTRGO" signal 155 is transmitted from the SDCTRL 115, The CNTR 150 will then count the number of cycles (i.e., how many RAMEN latches 135 are encountered) until a logical "1" value is seen by the CNTR 150. The count value contained in the CNTR 150 after the SDIN signal 160 transitions high (i.e., to a logical "1") is the most significant bits of the MAXADDR (maximum addresses) value 165, representing the number of memories under test by the BIST engine 110. The MAXADDR value 165 modifies the ADDRGEN (address generation) operation 170 such that all TSTADDR (test address) generation 175 is truncated once the MAXADDR value 165 is reached. By truncating the TSTADDR generation 175 once MAXADDR value 165 is reached, the BIST is run long enough to test each memory under test, and no longer.

The SHARED BIO circuit 130, additionally contains shared TESTGEN LOGIC (test generation logic) 180, which is logic used to stimulate the RAMs under test 140. The TESTGEN LOGIC 180 is controlled by the BIST FSM 145 and the TSTADDR signal 175. According to an aspect of the invention, the RAMs under test 140 respond to the generated TEST STIM control signals 185 and the RAMEN latches 135, and perform various operations. The operations result in data outputs that enter a multiplexer structure 190 controlled by the TSTADDR signal 175 (or a pipe delayed version thereof). The multiplexer structure 190 selects which memory output (e.g., from one of the RAMs under test 140) is actually being treated as the DATA OUT value 195 entering the shared COMPARE LOGIC (or comparison tree) 197. A modification of this embodiment would be the relocation of the RAMEN latches 135 to inside the RAM itself. This ensures that the RAMEN latches 135 are only added as more RAMs are connected to the SHARED BIO circuit 130, reducing the need to customize the shared BIO circuit 130 (e.g., the SHARED BIO circuit 130 would be independent of the number of RAMs sharing it).

Figure 2:
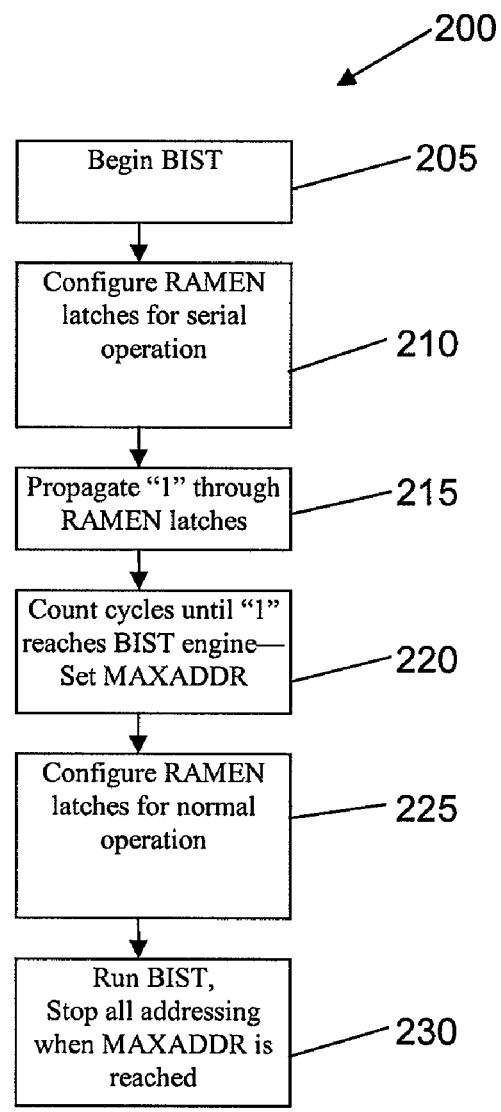
FIG. 2 shows an exemplary flow chart for implementing the present invention.

FIG. 2 shows an exemplary flow 200 for performing the present invention. FIG. 2 equally represents a high-level block diagram of the invention. As shown in FIG. 2, at step 205 a BIST is started. At step 210, the RAMEN latches are configured for serial operation. At step 215, a logical "1" signal is sent from the SD CTRL of the BIST engine and shifted or propagated through the RAMEN latches. At step 220, the CNTR, starting from zero, counts each cycle until the logical "1" signal is returned from the RAMEN latches to the SDCTRL of the BIST engine and the BIST engine sets the MAXADDR value to the total count determined by the CNTR.

At step 225, the RAMEN latches are configured for normal operation for testing the RAMs under test. At step 230, the BIST test is run and stops all addressing when the MAXADDR value has been reached.

While the invention has been described in terms of embodiments, those of skill in the art will recognize that the invention can be practiced with modifications and in the spirit and scope of the appended claims.

What is claimed is:

1. A method for testing integrated circuits (ICs) by automatically extending addressing for shared array built-in self-test (BIST) circuitry, comprising:
   polling a plurality of memories to determine which of the plurality of memories are sharing a first comparison tree;
   mapping a shared array BIST address space to each of the plurality of memories using the first comparison tree;
   estimating a shared array BIST completion time corresponding to a maximum total memory address size under test;
   reconfiguring the shared array BIST circuitry to accommodate the estimated shared array BIST latency/completion time; and
   testing the plurality of memories sharing the first comparison tree.

2. The method of claim 1, wherein:
   the polling the plurality of memories comprises:
      generating a logical "1" signal at a shared array BIST engine;
      reconfiguring a plurality of shared array BIST input/output macros comprising a plurality of random access memory (RAM) enable latches connected to the shared array BIST engine, so that the plurality of RAM enable latches pass the logical "1" signal sequentially through each of the plurality of RAM enable latches; and
      propagating the logical "1" signal sequentially through each of the plurality of RAM enable latches; and
   wherein
   the estimating of the shared array BIST completion time comprises counting a number of cycles for the logical "1" signal to return to the shared array BIST engine with a counter, wherein the number of cycles indicates at least one of a most significant bits of a maximum total memory address size under test and a maximum total number of memories sharing the first comparison tree.

3. The method of claim 2, further comprising configuring the plurality of RAM enable latches into a normal mode for the testing the plurality of memories sharing the first comparison tree.

4. The method of claim 2, wherein a value contained in the counter after the logical "1" signal returns to the shared array BIST engine is a most significant bits of a maximum address value, and wherein the reconfiguring the shared array BIST circuitry comprises modifying an address generation operation with the maximum address value such that test address generation is truncated once the maximum address value is reached and the testing the plurality of memories sharing the first comparison tree is run until the maximum address value is reached.

5. The method of claim 1, wherein the reconfiguring is performed while balancing the sharing of the first comparison tree and total test time required.

6. A system for testing integrated circuits (ICs) by automatically extending addressing for shared array built-in self-test (BIST) circuitry, comprising:

means for polling a plurality of memories to determine which of the plurality of memories are sharing a first comparison tree;

means for mapping a shared array BIST address space to each of the plurality of memories using the first comparison tree;

means for estimating a shared array BIST completion time corresponding to a maximum total memory address size under test;

means for reconfiguring the shared array BIST circuitry to accommodate the estimated shared array BIST completion time; and means for testing the plurality of memories sharing the first comparison tree, wherein:

the means for polling the plurality of memories comprises:

means for generating a logical "1" signal at a shared array BIST engine;

means for reconfiguring a plurality of shared array BIST input/output macros comprising a plurality of random access memory (RAM) enable latches connected to the shared array BIST engine, so that the plurality of RAM enable latches pass the logical "1" signal sequentially through each of the plurality of RAM enable latches; and means for propagating the logical "1" signal through each of the plurality of RAM enable latches; and wherein the means for estimating the shared array BIST completion time comprises means for counting a number of cycles for the logical "1" signal to return to the shared array BIST engine with a counter, wherein the number of cycles indicates at least one of a most significant bits of the maximum total memory address size under test and a maximum total number of memories sharing the first comparison tree.

7. The system of claim 6, wherein a value contained in the counter after the logical "1" signal returns to the shared array BIST engine is a most significant bits of a maximum address value, and wherein the means for reconfiguring the shared array BIST circuitry comprises a means for modifying an address generation operation with the maximum address value such that test address generation is truncated once the maximum address value is reached and the means for testing the plurality of memories sharing the first comparison tree is run until the maximum address value is reached.

* * * * *